United States Patent [19]

McCollum et al.

[11] Patent Number: 5,763,299

[45] Date of Patent: Jun. 9, 1998

[54] REDUCED LEAKAGE ANTIFUSE FABRICATION METHOD

[75] Inventors: John L. McCollum, Saratoga; Frank W. Hawley, Campbell, both of Calif.

[73] Assignee: Actel Corporation, Sunnyvale, Calif.

[21] Appl. No.: 614,282

[22] Filed: Mar. 12, 1996

Related U.S. Application Data

[62] Division of Ser. No. 472,050, Jun. 6, 1995, abandoned.

[51] Int. Cl.$^6$ .................................................... H01L 21/82
[52] U.S. Cl. .......................... 438/131; 438/467; 438/600
[58] Field of Search ............................ 437/60, 195, 922; 438/131, 467, 600

[56] References Cited

U.S. PATENT DOCUMENTS

| | | | |
|---|---|---|---|
| 4,651,409 | 3/1987 | Ellsworth et al. | 29/576 B |
| 4,748,490 | 5/1988 | Hollingsworth | 357/51 |
| 4,796,075 | 1/1989 | Whitten | 357/51 |
| 4,822,753 | 4/1989 | Pintchovski et al. | 437/192 |
| 4,847,732 | 7/1989 | Stopper et al. | 361/395 |
| 4,870,302 | 9/1989 | Freeman | 307/465 |
| 4,899,205 | 2/1990 | Hamdy et al. | 357/51 |
| 4,914,055 | 4/1990 | Gordon et al. | 437/192 |
| 4,933,576 | 6/1990 | Tamamura et al. | 307/465 |
| 4,943,538 | 7/1990 | Mohsen et al. | 437/52 |
| 5,070,384 | 12/1991 | McCollum et al. | 357/51 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,194,759 | 3/1993 | El-Ayat et al. | 307/202.1 |

(List continued on next page.)

FOREIGN PATENT DOCUMENTS

| | | | |
|---|---|---|---|
| 0 162 529 | 11/1985 | European Pat. Off. | H01L 29/32 |
| 0 323 078 | 7/1989 | European Pat. Off. | H01L 23/52 |
| 0 414 361 | 2/1991 | European Pat. Off. | H01L 23/52 |
| 0 416 903 | 3/1991 | European Pat. Off. | |
| 0 452 091 | 10/1991 | European Pat. Off. | H01L 23/525 |
| 0 455 414 | 11/1991 | European Pat. Off. | H01L 23/525 |
| 0 500 034 | 8/1992 | European Pat. Off. | H01L 23/525 |
| 0 501 120 | 9/1992 | European Pat. Off. | H01L 23/525 |
| 0 528 417 | 2/1993 | European Pat. Off. | G11C 17/16 |
| 0 539 197 | 4/1993 | European Pat. Off. | H01L 23/525 |
| 2 367 352 | 10/1977 | France | H01L 27/088 |
| 39 27 033 | 3/1990 | Germany . | |
| 5243385 | 9/1993 | Japan | 437/922 |
| 6204341 | 7/1994 | Japan | 437/922 |
| 2 222 024 | 2/1990 | United Kingdom | H01L 21/82 |
| 87/02827 | 5/1987 | WIPO | H01L 27/24 |

(List continued on next page.)

OTHER PUBLICATIONS

Burns, et al., "Titanium Dioxide Dielectric Films Formed by Rapid Thermal Oxidation", J. Appl. Phys. 65(5), Mar. 1, 1989, pp. 2095–2097.

Cohen et al., "A Flat–Aluminum Based Voltage–Programmable Link for Field–Programmable Devices", IEEE Transactions on Electron Devices, vol. 41, No. 5, May 1994, pp. 721–724.

Gordon et al., "Conducting Filament of the Programmed Metal Electrode Amorphous Silicon Antifuse", 1993 IEEE, IEDM, pp. 93-27 to 93-30.

Hu, C., "Interconnect Devices for Field programmable Gate Array", 1992 IEEE, IEDM, pp. 92–591 to 92–594.

Pauleau, Y., "Interconnect Materials for VLSI Circuits", Solid State Technology, Apr., 1987, pp. 155–162.

Primary Examiner—Charles L. Bowers, Jr.
Assistant Examiner—Lynne A. Gurley
Attorney, Agent, or Firm—D'Alessandro & Ritchie

[57] ABSTRACT

An antifuse includes an antifuse material disposed between a lower conductive electrode and an upper conductive electrode. The antifuse material includes a layer of amorphous silicon disposed between two layers of silicon nitride. A thin layer of silicon dioxide is disposed between the layer of amorphous silicon and one of the silicon nitride layers.

4 Claims, 6 Drawing Sheets

U.S. PATENT DOCUMENTS

| | | | |
|---|---|---|---|
| 5,196,724 | 3/1993 | Gordon et al. | 257/530 |
| 5,219,782 | 6/1993 | Liu et al. | 437/922 |
| 5,233,217 | 8/1993 | Dixit et al. | 257/530 |
| 5,241,496 | 8/1993 | Lowrey et al. | 365/96 |
| 5,242,851 | 9/1993 | Choi | 437/49 |
| 5,248,632 | 9/1993 | Tung et al. | 437/195 |
| 5,250,464 | 10/1993 | Wong et al. | 437/92 |
| 5,266,829 | 11/1993 | Hamdy et al. | 257/530 |
| 5,270,251 | 12/1993 | Cohen | 437/173 |
| 5,272,101 | 12/1993 | Forouhi et al. | 437/50 |
| 5,272,666 | 12/1993 | Tsang et al. | 365/96 |
| 5,284,788 | 2/1994 | Spratt et al. | 437/52 |
| 5,286,993 | 2/1994 | Lowrey et al. | 257/390 |
| 5,290,734 | 3/1994 | Boardman et al. | 437/195 |
| 5,293,133 | 3/1994 | Birkner et al. | 324/713 |
| 5,298,784 | 3/1994 | Gambino et al. | 257/529 |
| 5,300,456 | 4/1994 | Tigelaar et al. | 437/195 |
| 5,302,546 | 4/1994 | Gordon et al. | 437/170 |
| 5,304,508 | 4/1994 | Cohen | 437/170 |
| 5,308,795 | 5/1994 | Hawley et al. | 437/195 |
| 5,322,812 | 6/1994 | Dixit et al. | 437/60 |
| 5,327,024 | 7/1994 | Cox | 307/465 |
| 5,328,865 | 7/1994 | Boardman et al. | 437/60 |
| 5,329,153 | 7/1994 | Dixit | 257/530 |
| 5,332,929 | 7/1994 | Chiang | 307/296.3 |
| 5,353,246 | 10/1994 | Tsang et al. | 365/96 |
| 5,381,035 | 1/1995 | Chen et al. | 257/530 |
| 5,387,311 | 2/1995 | Hall et al. | 156/630 |
| 5,390,141 | 2/1995 | Cohen et al. | 365/96 |
| 5,391,513 | 2/1995 | Delgado et al. | 437/60 |
| 5,391,518 | 2/1995 | Bhushan | 437/190 |
| 5,395,797 | 3/1995 | Chen et al. | 437/195 |
| 5,403,778 | 4/1995 | Kwok et al. | 437/188 |
| 5,404,029 | 4/1995 | Husher et al. | 257/50 |
| 5,411,917 | 5/1995 | Forouhi et al. | 437/195 |
| 5,412,245 | 5/1995 | Favreau | 257/530 |
| 5,412,593 | 5/1995 | Magel et al. | 365/96 |
| 5,440,167 | 8/1995 | Iranmanesh | 437/922 |
| 5,482,884 | 1/1996 | McCollum et al. | 437/60 |
| 5,485,031 | 1/1996 | Zhang et al. | 257/530 |
| 5,502,000 | 3/1996 | Look et al. | 437/922 |
| 5,541,441 | 7/1996 | Yeouchung et al. | 257/530 |

FOREIGN PATENT DOCUMENTS

| | | | |
|---|---|---|---|
| 87/00969 | 2/1989 | WIPO | H01L 23/52 |
| 92/13359 | 8/1992 | WIPO | H01L 21/285 |
| 92/20109 | 11/1992 | WIPO | H01L 45/00 |
| 93/03499 | 2/1993 | WIPO | H01L 23/525 |
| 93/04499 | 3/1993 | WIPO | H01L 21/70 |
| 93/05514 | 3/1993 | WIPO | G11C 17/16 |

REDUCED LEAKAGE ANTIFUSE FABRICATION METHOD

CROSS-REFERENCE TO RELATED APPLICATIONS

This application is a division of U.S. patent application Ser. No. 08/472,050, filed 6 Jun., 1995, now abandoned, in the names of inventors John L. McCollum and Frank Hawley and entitled "Reduced Leakage Antifuse Structure and Fabrication Method."

BACKGROUND OF THE INVENTION

1. Field Of The Invention

The present invention relates to antifuses. More particularly, the present invention relates to an improved metal-to-metal amorphous silicon antifuse structure and fabrication method.

2. The Prior Art

A common problem with amorphous silicon antifuses is the high level of leakage exhibited by unprogrammed antifuses. This leakage is typically a few nanoamperes at an applied voltage of 5 volts. In isolation, such leakage exhibited by a single antifuse might be considered to be insignificant. The problem becomes apparent, however, when practical antifuse based products are considered. Large FPGA integrated circuits may employ more than one million antifuses having an aggregate leakage of a few milliamperes. This leakage rapidly worsens with temperatures, especially high temperatures of 70° to 125° C. which may be encountered in FPGA arrays under normal operating conditions.

The addition of one or more layers of silicon nitride to the antifuse layer (typically silicon nitride-amorphous silicon-silicon nitride antifuse material) does not significantly reduce this leakage. There is thus a need for an antifuse structure which avoids this problem.

In addition, a problem in antifuse arrays has been the unintended programming of antifuses during the process of programming intended antifuses. An antifuse structure which would aid in preventing the unintended programming of antifuses while substantially reducing the leakage of unprogrammed antifuses would also be desirable.

It is therefore an object of the present invention to provide an antifuse having reduced leakage in its unprogrammed state.

It is a further object of the present invention to provide an antifuse which may be disposed in an array of antifuses and which is less susceptible to unintentional programming than prior art antifuses.

BRIEF DESCRIPTION OF THE INVENTION

An antifuse according to the present invention comprises an antifuse material disposed between a lower conductive electrode and an upper conductive electrode. The antifuse material comprises a layer of amorphous silicon disposed between two layers of silicon nitride. A thin layer of silicon dioxide (i.e., from about 1 to about 300 angstroms, preferably about 30 angstroms) is disposed between the layer of amorphous silicon and one of the silicon nitride layers.

In a first embodiment of the present invention, the thin layer of silicon dioxide is disposed between the layer of amorphous silicon and the lower silicon nitride layer. In a second embodiment of the present invention, the thin layer of silicon dioxide is disposed between the layer of amorphous silicon and the upper silicon nitride layer. The antifuse of the first embodiment of the invention exhibits a higher BVG in a direction where the positive Vpp potential is applied to the lower electrode. The antifuse of the second embodiment of the invention exhibits a higher BVG in a direction where the positive Vpp potential is applied to the upper electrode. The amount of the difference in BVG in both cases is about 0.5 to 3 volts, typically about 2 volts.

It has been determined by the inventors that the antifuse of the present invention exhibits leakage in its unprogrammed state of about a few to tens of picoamperes at 5 volts. This is lower than the leakage of prior art antifuses by a factor of about 100.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
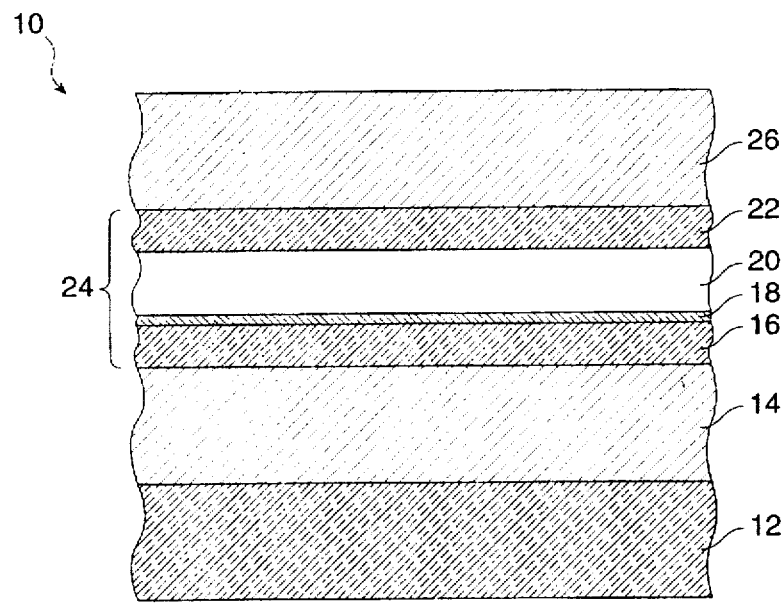
FIG. 1 is a cross sectional view of an antifuse according to a first embodiment of the present invention.
Figure 2:
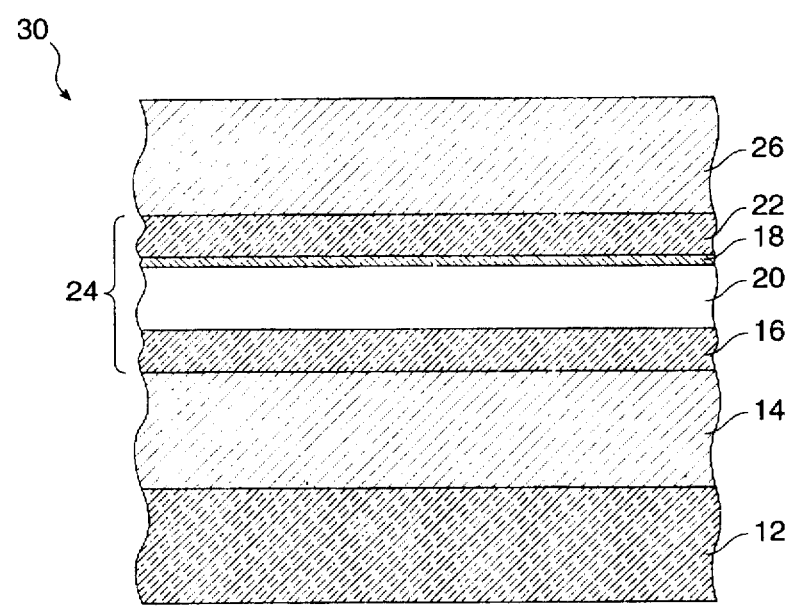
FIG. 2 is a cross sectional view of an antifuse according to a second embodiment of the present invention.

Referring first to FIGS. 1 and 2, two embodiments of antifuses according to the present invention are shown in cross-sectional view. Those of ordinary skill in the art will understand that FIGS. 1 and 2 merely show the relative positions of the various layers which comprises the antifuses depicted therein, and that various antifuse geometries may be employed in practicing the present invention, such as ones in which the lower electrode and antifuse material are disposed below the interlayer dielectric containing the aperture, ones in which the layers comprising the antifuse material are disposed in the antifuse aperture in the interlayer dielectric, ones, in which the layers comprising the antifuse material are located above a plug in the antifuse aperture, and ones employing combinations of these concepts.

Referring first to FIG. 1, an antifuse 10 according to the first embodiment of the present invention is shown in cross-sectional view. Antifuse 10 is fabricated over a substrate 12. Those of ordinary skill in the art will recognize that substrate 12 may comprise an insulating layer disposed over a semiconductor substrate containing active devices or over a conducting substrate, or substrate 12 may itself be a substrate formed from an insulating material.

A lower conductive electrode 14 for antifuse 10 is disposed over the upper surface of substrate 12 and may be formed from materials such as titanium nitride/aluminum. Usually, although not necessarily, lower conductive electrode 14 is defined from a portion of a metal interconnect layer in an integrated circuit and persons of ordinary skill in the art will readily appreciate that lower conductive electrode 14 may be formed from any of the known materials used for such purposes. Such layers have thicknesses typically in the range of from about 5,000 angstroms to about 12,000 angstroms, typically about 9,000 angstroms.

A first silicon nitride layer 16 is disposed on the upper surface of lower conductive electrode 14. First silicon nitride layer 16 may typically have a thickness in the range of from about 1 angstrom to about 300 angstroms, preferably about 65 angstroms. A thin layer of silicon dioxide 18 (i.e., from about 1 to about 300 angstroms, preferably about 30 angstroms) is disposed on the upper surface of first silicon nitride layer 16. A layer of amorphous silicon 20, having a thickness of between about 100 angstroms to about 1,500 angstroms, typically about 450 angstroms, is disposed on the upper surface of silicon dioxide layer 18. Amorphous silicon layer 20 may be undoped or may be doped to a concentration of less than 1e18 using phosphorus, arsenic, nitrogen, or oxygen as a dopant species. A second silicon nitride layer 22 is disposed on the upper surface of amorphous silicon layer 20. Second silicon nitride layer 22 may typically have a thickness in the range of from about 1 angstrom to about 300 angstroms, preferably about 65 angstroms. Together, layers 16, 18, 20, and 22 comprise a composite antifuse material 24.

The final element of antifuse 10 of FIG. 1 is an upper conductive electrode 26 disposed over the upper surface of second silicon nitride layer 22. As with the lower conductive electrode 14, upper conductive electrode 26 may comprise a portion of a metal interconnect layer and may be formed from materials known for use for this purpose. As will be appreciated by those of ordinary skill in the art, both lower conductive electrode 14 and upper conductive electrode 26 may include a barrier layer (not shown in FIG. 1).Those of ordinary skill in the art will appreciate that other layers, such as passivation, will be employed in the fabrication of actual devices containing the antifuse of the present invention. Such layers, their purpose and formation processes are well known in the art and will not be described herein in order to avoid overcomplicating the disclosure and thus obscuring the disclosure of the present invention.

A second embodiment of an antifuse according to the present invention is depicted in cross-sectional view in FIG. 2. Antifuse 30 of FIG. 2 is similar to antifuse 10 of FIG. 1 except for the location of the thin oxide layer 18. For ease of understanding of the disclosure, elements of antifuse 30 which are present in antifuse 10 will be designated by the same reference numerals as their counterparts in FIG. 1. Persons of ordinary skill in the art will appreciate that the various layers in antifuse 30 of FIG. 2 may comprise the same materials as the corresponding layers in the antifuse 10 of FIG. 1, and may have the same or similar thicknesses.

Thus, from an examination of FIG. 2, it may be seen that antifuse 30 is also fabricated over substrate 12. A lower conductive electrode 14 for antifuse 30 is formed on the upper surface of substrate 12. As in the embodiment of FIG. 1, lower conductive electrode 14 is defined is usually defined from a portion of a metal interconnect layer in an integrated circuit.

A first silicon nitride layer 16 is disposed on the upper surface of lower conductive electrode 14. So far, the antifuse 30 of FIG. 2 is identical to the antifuse 10 of FIG. 1.

It is at this point in the structure that the antifuses of FIGS. 1 and 2 differ. Unlike the antifuse 10 of FIG. 1, a layer of amorphous silicon 20 is disposed on the upper surface of first silicon nitride layer 16 in the antifuse 30 of FIG. 2. Amorphous silicon layer 20 may be undoped or may be doped to a concentration of less than 1e18 using phosphorus, arsenic, nitrogen, or oxygen as a dopant species.

A thin layer of silicon dioxide 18 (i.e., from about 1 to about 300 angstroms, preferably about 30 angstroms) is disposed on the upper surface of amorphous silicon layer 20. A second silicon nitride layer 22 is disposed on the upper surface of the thin layer of silicon dioxide 18.

The final element of antifuse 30 of FIG. 2 is an upper conductive electrode 26 disposed over the upper surface of second silicon nitride layer 22. As with the lower conductive electrode 14, upper conductive electrode 26 may comprise a portion of a metal interconnect layer and may be formed from materials known for use for this purpose. As in the antifuse of FIG. 1, both lower conductive electrode 14 and upper conductive electrode 26 in antifuse 30 of FIG. 2 may include a barrier layer (not shown in FIG. 2).

As in the antifuse 10 of FIG. 1, those of ordinary skill in the art will appreciate that other layers, such as passivation, will be employed in the fabrication of actual devices containing the antifuse 30 of the present invention depicted in FIG. 2. Such layers, their purpose and formation processes are well known in the art and will not be described herein in order to avoid overcomplicating the disclosure and thus obscuring the disclosure of the present invention.

Layers 16, 18, 20, and 22 together form the antifuse material 24 of antifuses 10 and 30 of FIGS. 1 and 2, respectively. The combined thicknesses of its constituent layers will determine the voltage at which antifuses 10 and 30 will program, i.e., change from a high-impedance to a low-impedance state. As an example, an antifuse 10 of FIG. 1 according to the present invention including a first silicon nitride layer 16 having a thickness of about 65 angstroms, a thin layer of silicon dioxide 18 having a thickness of about 30 angstroms, a layer of amorphous silicon 20, having a thickness of about 450 angstroms, and a second silicon nitride layer 22 having a thickness of about 65 angstroms will exhibit a programming voltage of about 12 volts if the positive potential is applied to the lower conductive electrode 14 and about 10.5 volts if the positive potential is applied to the upper conductive electrode 26. If the antifuse of FIG. 2 is fabricated using the above-recited layer thicknesses, it will exhibit a programming voltage of about 12 volts if the positive potential is applied to the upper conductive electrode 26 and about 10.5 volts if the positive potential is applied to the lower conductive electrode 14.

The addition of the thin layer of silicon dioxide 18 between one of the silicon nitride layers 16 and 22 and amorphous silicon layer 20 in both antifuses 10 of FIG. 1 and 30 of FIG. 2 dramatically reduces the leakage of antifuses 10 and 30 by a factor of about 100. This remarkable reduction in leakage is believed to be due to the fact that nitride is a hole conductor and oxide is an electron conductor. This causes the nitride to support a much larger voltage at a reduced leakage as the conduction is limited to electrons.

In antifuses 10 and 30 configured according to the present invention, the reduction in leakage is affected in both directions, whereas the BVG is only affected in one direction. Thus it is possible to adjust which direction of current flow has a lower breakdown voltage. Herein lies the practical reason for the difference between antifuse 10 of FIG. 1 and antifuse 30 of FIG. 2. By choosing to place the oxide 18 between the first silicon nitride layer 16 and the amorphous silicon layer 20 or between the amorphous silicon layer 20 and the second silicon nitride layer 22, programming yield can be improved by reducing the chances of programming antifuses that should not be programmed but are nevertheless stressed at large voltages during programming.

The advantage provided by this non-symmetrical programming voltage feature of the present invention is the ability to avoid unintentional programming of antifuses in an array by spurious programming paths which place reverse polarity programming voltages across them.

As previously noted, the composite antifuse material 24 described above may be disposed in an antifuse aperture formed in an interlayer dielectric layer, or may be formed entirely or partly above or below such an aperture if conductive plug technology or similar technology is used. Any particular antifuse geometry using the antifuses according to the present invention thus falls within the scope of the present invention.

Numerous processes can be used to formulate the antifuses of the present invention. The exact order of the processing steps will depend upon the particular antifuse geometry desired. For example, if plug-type antifuses are fabricated according to the teachings of the present invention, the steps for forming an interlayer dielectric, forming an aperture therein, and plug formation will precede the steps used to form the multilayer composite antifuse material 24. In other planar antifuse structures, the steps used to form the multilayer composite antifuse material 24 will be performed prior to the steps for forming an interlayer dielectric, forming an aperture therein and forming the upper antifuse electrode.

In any process for fabricating the antifuses of the present invention, the thin layer of oxide 18 in the multilayer composite antifuse material 24 can be formed using various methods including plasma oxidations, plasma depositions, other CVD methods, and thermal oxidation in an oxygen environment. According to a presently preferred embodiment of the invention, the oxide layer 18 is formed by plasma oxidation in $O_2$. This process can be performed in equipment commonly used to remove photoresist. As will be appreciated by those of ordinary skill in the art, this process may also be performed in situ during the nitride and silicon depositions in the same piece of equipment, thereby simplifying the antifuse fabrication process.

Referring now to FIGS. 3a–3e, cross sectional views of two alternative versions of an antifuse according to the first embodiment of the invention are presented showing the structure resulting after performance of selected steps in the fabrication process. The particular antifuse geometry depicted in FIGS. 3a–3e is that of a plug antifuse, but persons of ordinary skill in the art will understand that the concepts of the present invention are not limited to the particular antifuse geometry depicted in the figures. In fact, such skilled persons will understand that the present invention may be employed in virtually any form of antifuse, such as ones in which the composite antifuse material is formed within a via formed in an interlayer dielectric material, or wholly or partially above or below such a via.

Figure 3A:
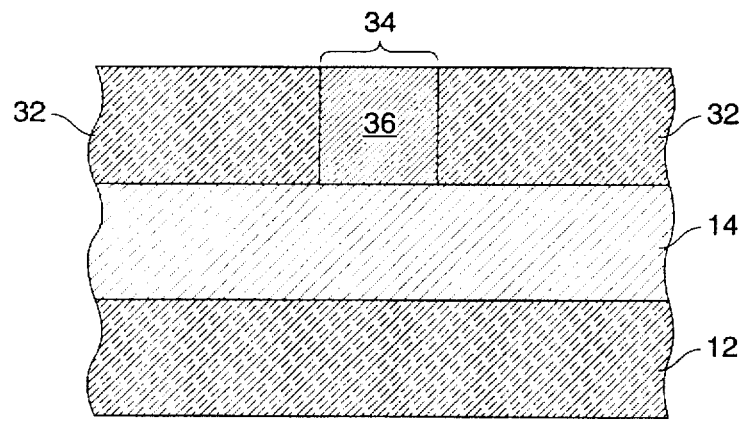
FIGS. 3a–3e are cross sectional views of an antifuse having an antifuse material structure like that of FIG. 1 after completion of selected steps in the fabrication process.

Referring initially to FIG. 3a, a lower conductive electrode 14 has been formed on the upper surface of substrate 12, which will usually, but not necessarily, comprise an insulating layer disposed above other layers in a microcircuit. Lower conductive electrode 14 is most often a portion of a metal interconnect layer in an integrated circuit and will thus be formed from materials employed in such layers using standard processing techniques, but those of ordinary skill in the art will recognize that many other conductive materials could be used instead.

An interlayer dielectric layer 32 is formed over the upper surface of lower conductive electrode 14. Interlayer dielectric layer 32 is typically formed from a material such as CVD silicon dioxide typically ranging in thickness from about 5,000 angstroms to 15,000 angstroms, usually about 9,000 angstroms. A conventional masking and etching sequence is next employed to form an antifuse aperture 34 communicating with the upper surface of lower electrode 14 through interlayer dielectric layer 32.

A conductive plug 36, comprising a material such as tungsten, is formed in antifuse aperture 34 using techniques such as blanket deposition followed by an etching step to planarize the top of the conductive plug 36 and the upper surface of the interlayer dielectric layer 32. Tungsten plug technology is well known in the art. FIG. 3a shows the structure resulting after performance of the aforementioned steps.

Figure 3B:
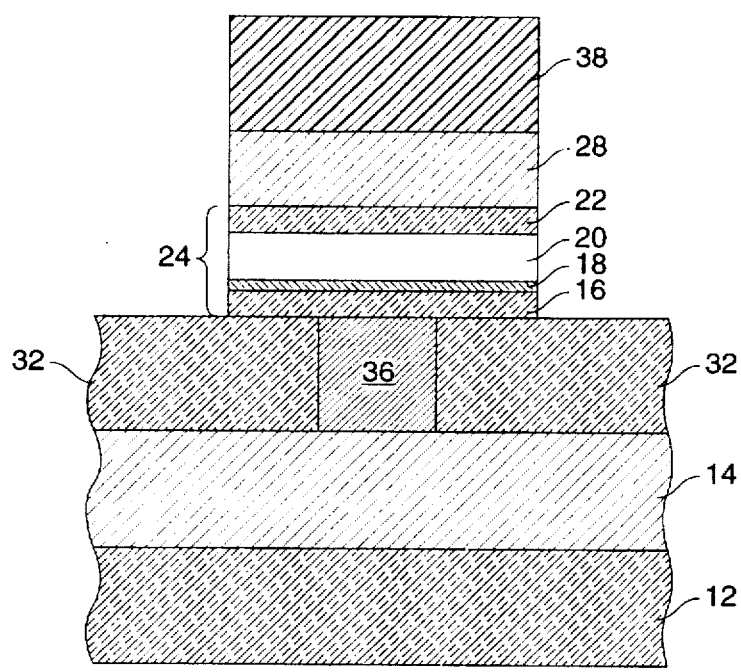

Referring now to FIG. 3b, composite antifuse material layer 24 is formed. According to a presently preferred embodiment of the invention, a first layer of silicon nitride 16 is formed to a thickness of between about 1 angstrom and about 300 angstroms, typically about 65 angstroms, using CVD techniques. Next, a thin layer of silicon dioxide 18, having a thickness of between about 1 to 300 angstroms, preferably about 30 angstroms, is formed over the upper surface of silicon nitride layer 16, preferably using CVD techniques. A layer of amorphous silicon 20 is then formed over the silicon dioxide layer 18 to a thickness of between about 100 angstroms and about 1,500 angstroms, typically about 450 angstroms, using CVD techniques. The amorphous silicon layer 20 may be undoped or may be doped to a level of preferably less than about 1e18 using phosphorous, arsenic, nitrogen, or oxygen. A second silicon nitride layer 22 having a thickness of between about 1 angstrom and about 300 angstroms, typically about 65 angstroms, is next formed over the surface of the amorphous silicon layer 20 using CVD techniques. A barrier layer 28 of titanium nitride, having a thickness of between about 500 angstroms and about 3,000 angstroms, typically about 2,000 angstroms, is next formed over the surface of the second silicon nitride layer 22. As will be understood by those of ordinary skill in the art, barrier layer 28 not only serves to act to prevent interdiffusion of the metal electrode material into the antifuse material, but also functions as an etch stop for the etching of the antifuse stack to be performed in the next process step.

After completion of the stacked antifuse material structure 24, and the barrier layer 28, a masking layer 38 is placed over the upper surface of barrier layer 28 and the stack is defined using a stack etching step. Several etching methods, such as RIE or plasma, may be employed to perform this step. FIG. 3b shows the structure resulting after performance of the stack etching step but prior to removal of masking layer 38.

Figure 3C:
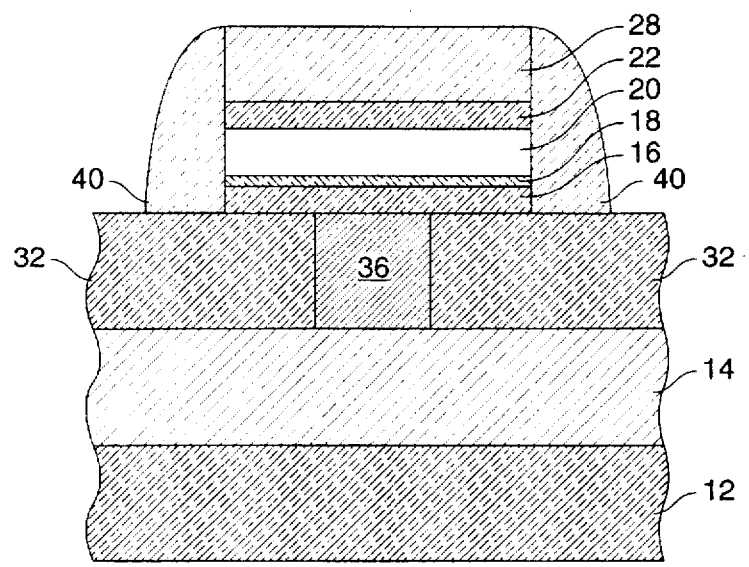

Referring now to FIG. 3c, the masking layer 38 is then removed and an oxide spacer 40 is formed around the edge of the stacked structure. As is well known in the art, the spacer 40 may be formed by a blanket deposition of silicon dioxide (i.e., about 3,000 angstroms) followed by a plasma etching step. As will be appreciated by those of ordinary skill in the art, spacer 40 improves the step coverage of the layers overlying the stack in the completed antifuse and also prevents diffusion of atoms from the upper electrode into the composite antifuse material 24. FIG. 3c shows the structure resulting after completion of the spacer etching step.

Figure 3D:
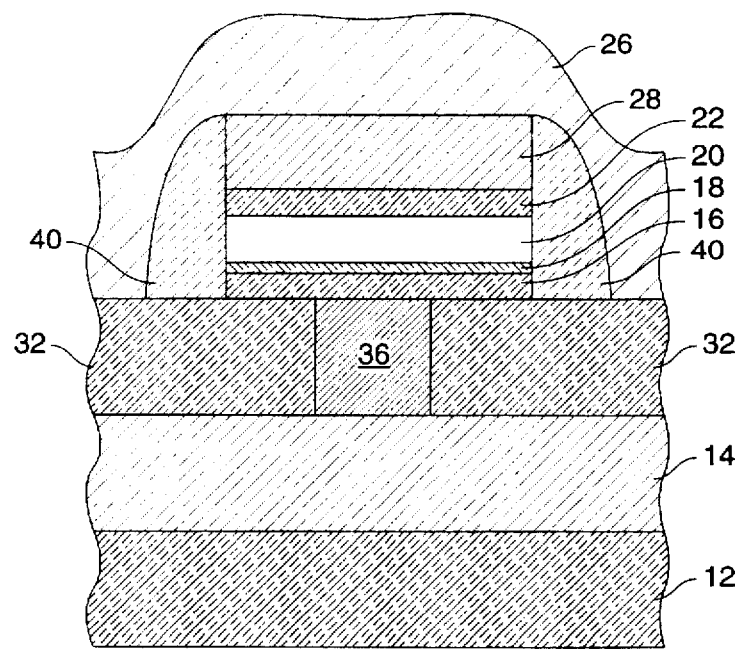

Next, with reference to FIG. 3d, the upper conductive electrode 26 is formed over the stacked structure, the oxide spacers 40, and the interlayer dielectric 32. As will be appreciated by those of ordinary skill in the art, upper conductive electrode 26 may be formed from a portion of an interconnect metal layer in an integrated circuit and fabrication of this layer is well known to such skilled persons. Additional conventional back-end steps (not shown) are then used to passivate and otherwise complete the integrated circuit structure.

As an alternative to the use of oxide spacers 40, those of ordinary skill in the art will recognize that the barrier layer 28 may be formed after performance of the stack etch step and removal of photoresist layer 38, and would thus serve to encapsulate the stacked antifuse structure 24. The upper conductive electrode 26 would then be formed over the barrier layer 28 and the two would be defined using conventional masking and etching steps. Such a variation on the antifuse structure of the present invention is depicted in FIG. 3e, a cross-sectional view of the antifuse shown after completion of the steps to form the blanket barrier layer 28 and the overlying upper conductive electrode 26.

Figure 3E:
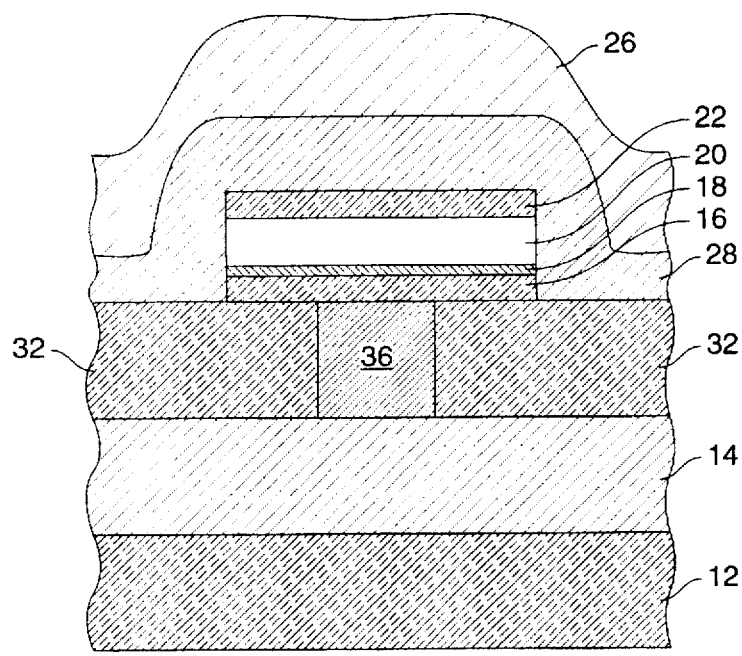

The barrier layer 28 in the embodiment shown in FIG. 3e has step coverage adequate to eliminate the spacers 40 and also performs the function of preventing diffusion of metal atoms into the composite antifuse material 24. The design choice of whether the spacers or blanket barrier layer are to be used will largely depend on the capabilities of the wafer fabrication facility in which the integrated circuits will be manufactured.

Referring now to FIGS. 3a and 4a–4d, cross sectional views of two variations of an antifuse according to the second embodiment of the invention (FIG. 2) are presented showing the structure resulting after performance of selected steps in the fabrication process. As with the antifuse shown progressively fabricated in FIGS. 3a–3d, the antifuse geometry depicted in FIGS. 3a and 4a–4d is a plug antifuse, but persons of ordinary skill in the art will understand that the present invention is not limited to this particular antifuse geometry. Further, the details of the fabrication steps relating to materials, formation and etching processes, thicknesses, etc., are the same as those recited for the fabrication of the antifuse shown in FIG. 1 and will not be needlessly repeated.

Referring again to FIG. 3a, the fabrication of a plug-type antifuse having a composite antifuse material structure like that shown in FIG. 2 starts out utilizing the same steps which would be used to fabricate a plug-type antifuse having a composite antifuse material structure shown in FIG. 1. The lower conductive electrode 14 has been formed on the upper surface of substrate 12. The interlayer dielectric layer 32 is formed over the upper surface of lower conductive electrode 14, and a conventional masking and etching sequence is next employed to form an antifuse aperture 34 communicating with the upper surface of lower electrode 14 through interlayer dielectric layer 32.

A conductive plug 36, comprising a material such as tungsten, is formed in aperture 34 using techniques such as blanket deposition followed by an etching step to planarize the top of the plug 36 and the upper surface of the interlayer dielectric layer 32. Tungsten plug technology is well known in the art. FIG. 3a shows the structure resulting after performance of the aforementioned steps.

Figure 4A:
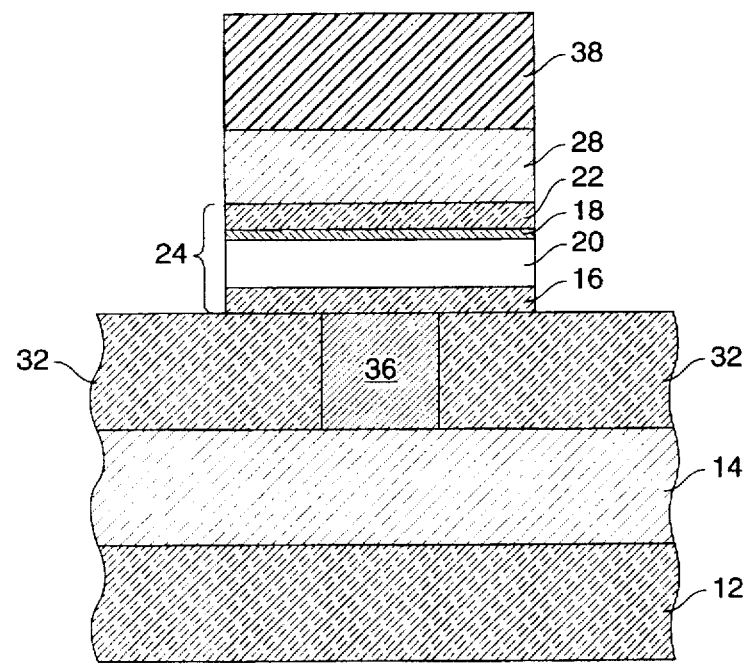
FIGS. 4a–4d are cross sectional views of an antifuse having an antifuse material structure like that of FIG. 2 after completion of selected steps in the fabrication process.

Referring now to FIG. 4a, the difference between the fabrication of an antifuse having the composite antifuse structure shown in FIG. 1 and an antifuse having the composite antifuse structure shown in FIG. 2 may be easily seen. A first layer of silicon nitride 16 is formed. A layer of amorphous silicon 20 is then formed over the first silicon nitride layer 16. Next, a thin layer of silicon dioxide 18 is formed over the upper surface of amorphous silicon layer 20. A second silicon nitride layer 22 is next formed over the surface of the thin silicon dioxide layer 18. Finally, a barrier layer 28, formed from a material such as titanium nitride, is formed over the surface of second silicon nitride layer 22.

After completion of the stacked antifuse material structure 24, a masking layer 38 is placed over the upper surface of barrier layer 28 and the stack is defined using an etching step. FIG. 4a shows the structure resulting after performance of the stack etching step but prior to removal of masking layer 38.

Figure 4B:
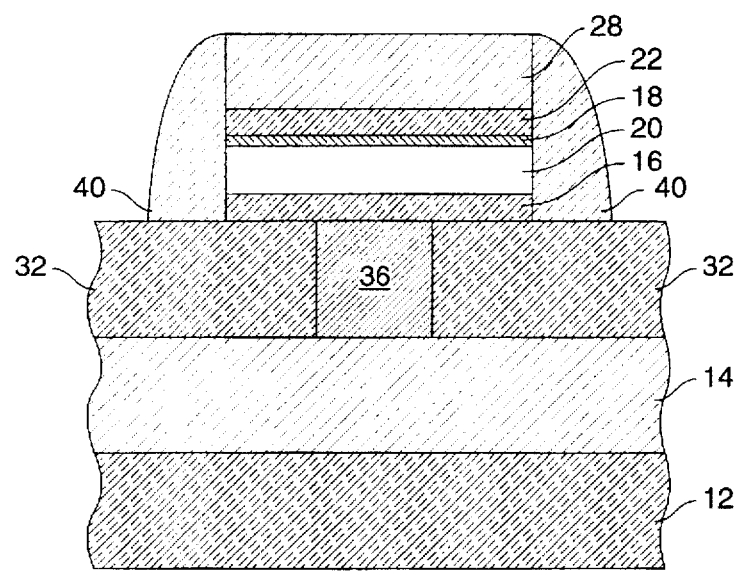

Referring now to FIG. 4b, the masking layer 38 is then removed and an oxide spacer 40 is formed around the edge of the stacked structure to improve step coverage for overlying layers and to prevent diffusion of metal atoms from the metal electrodes into the antifuse material. FIG. 4b shows the structure resulting after completion of the spacer etching step.

Figure 4C:
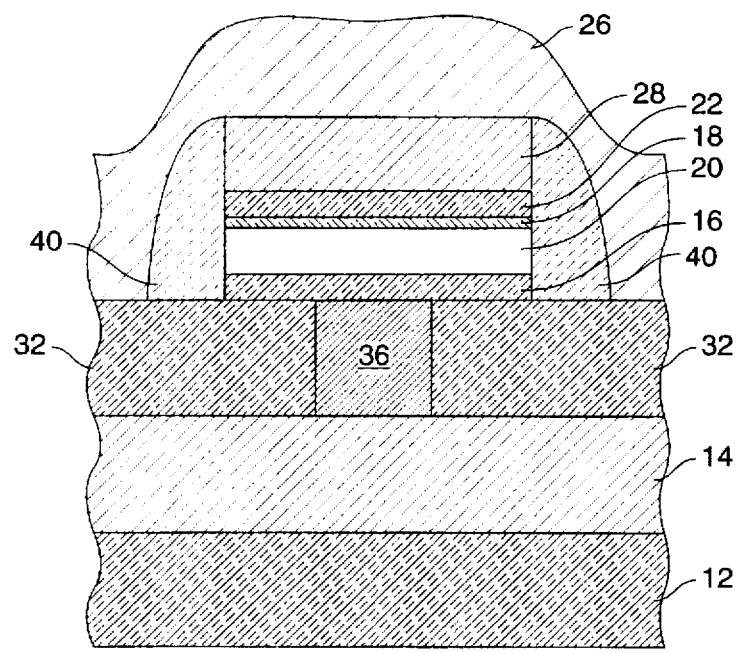

Next, with reference to FIG. 4c, the upper conductive electrode 26 is formed over the stacked structure, the oxide spacers 40, and the interlayer dielectric layer 32. As in the instance of the previously disclosed embodiment, additional conventional back-end steps (not shown) are then used to passivate and otherwise complete the integrated circuit structure. In addition, those skilled in the art will understand that, as was the case in the embodiment of FIG. 1, the spacers may be eliminated in favor of a blanket barrier layer deposition step after removal of the photomask 38.

Figure 4D:
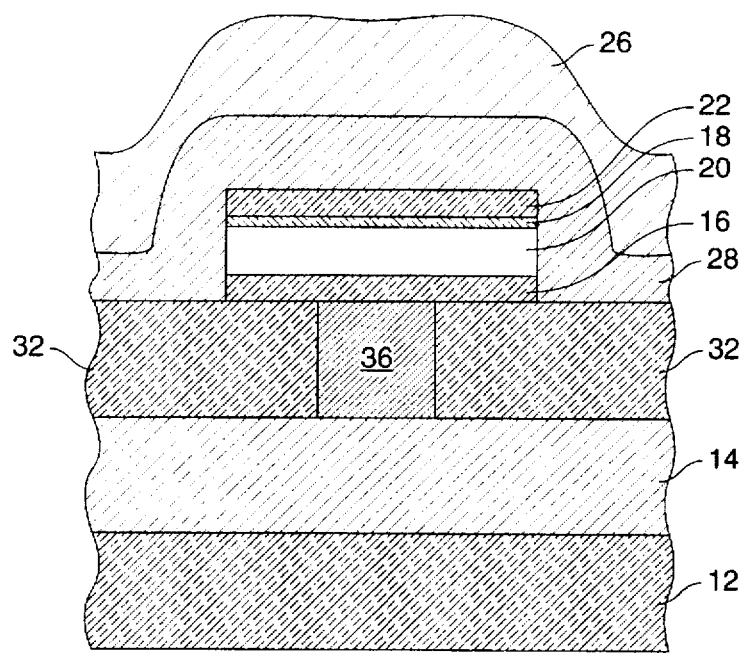

FIG. 4d is a cross-sectional view of an antifuse according to a variation of the present invention wherein a blanket barrier layer 28, formed from a material such as titanium nitride, is formed after removal of masking layer 38. An upper conductive electode 26 is then formed over the upper surface of barrier layer 28. FIG. 4d shows the structure resulting after completion of these steps and prior to conventional back-end processing steps used to complete the integrated circuit.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for fabricating an antifuse comprising the steps of:

forming a lower conductive electrode;

forming a first layer of silicon nitride on an upper surface of said lower conductive electrode;

forming a layer of amorphous silicon on an upper surface of said first layer of silicon nitride;

forming a layer of silicon dioxide on an upper surface of said layer of amorphous silicon said layer of silicon dioxide having a thickness of about 1 to about 300 angstroms;

forming a second layer of silicon nitride on an upper surface of said layer of silicon dioxide; and forming an upper conductive electrode on an upper surface of said second layer of silicon nitride.

2. The method of claim 1 further including the steps of stack etching outer edges of said first layer of silicon nitride, said layer of amorphous silicon, said layer of silicon dioxide, and said second layer of silicon nitride to form a stack and forming an oxide spacer in contact with a stack wall prior to the step of forming said upper conductive electrode.

3. A method for fabricating an antifuse comprising the steps of:

forming a lower conductive electrode;

forming a first layer of silicon nitride on an upper surface of said lower conductive electrode;

forming a layer of silicon dioxide on an upper surface of said first layer of silicon nitride said layer of silicon dioxide having a thickness of about 1 to about 300 angstroms;

forming a layer of amorphous silicon on an upper surface of said layer of silicon dioxide;

forming a second layer of silicon nitride on an upper surface of said layer of amorphous silicon; and forming an upper conductive electrode on an upper surface of said second layer of silicon nitride.

4. The method of claim 3 further including the steps of stack etching outer edges of said first layer of silicon nitride, said layer of silicon dioxide, said layer of amorphous silicon, and said second layer of silicon nitride to form a stack and forming an oxide spacer in contact with a stack wall prior to the step of forming said upper conductive electrode.

* * * * *

UNITED STATES PATENT AND TRADEMARK OFFICE
CERTIFICATE OF CORRECTION

PATENT NO. : 5,763,299
DATED : June 9, 1998
INVENTOR(S) : John McCollum and Frank Hawley It is certified that error appears in the above-identified patent and that said Letters Patent is hereby corrected as shown below:

Title page,

Related U.S. Application Data: replace "Division of Ser. No. 472,050, Jun. 6, 1995, abandoned. " with --Division of pending application Ser. No. 472,050, Jun. 6, 1995.--

Signed and Sealed this

Sixteenth Day of February, 1999

*Attest:*

*Attesting Officer*

*Acting Commissioner of Patents and Trademarks*